Jan. 17, 1967 R. EMEIS ET AL 3,298,878

SEMICONDUCTOR P-N JUNCTION DEVICES AND METHOD FOR THEIR MANUFACTURE

Filed March 10, 1964

3,298,878

SEMICONDUCTOR P-N JUNCTION DEVICES AND METHOD FOR THEIR MANUFACTURE

Reimer Emeis, Ebermannstadt, and Arnulf Hoffmann, Pretzfeld, Germany, assignors to Siemens-Schuckertwerke Aktiengesellschaft, Berlin-Siemensstadt, Germany, a corporation of Germany Filed Mar. 10, 1964, Ser. No. 350,842
Claims priority, application Germany, Mar. 13, 1963, S 84,128
5 Claims. (Cl. 148—177)

Our invention relates to diodes, controlled rectifiers, transistors, and other electronic semiconductor devices, as well as to a method of producing them.

As a rule, such devices comprise a monocrystalline semiconductor body, for example of germanium or silicon, which has differently doped regions in contact with respective electrodes. According to a known production method, a monocrystalline semiconductor body of a given conductance type is alloyed together with an electrode plate or foil of metal which contains dopant for producing the other conductance type in the semiconductor material. For germanium or silicon the electrode foil may consist of gold with an addition of antimony to serve as donor. Also applicable is aluminum which serves both as a material for the contact electrode and as an acceptor dopant. When the metal member is being alloyed into the surface of the semiconductor body, a reversely doped recrystallization region and an adjacent electrode are produced, the latter consisting as a rule of metal-semiconductor eutectic, for example when employing gold and aluminum. A p-n junction is thus formed between the reversely doped recrystallization region and the portion of the semiconductor body that remained unaffected by the alloying operation. The p-n junction can withstand a certain amount of voltage in the inverse (blocking) direction. Up to a given value of inverse voltage, only a very slight inverse current can pass through the junction device. When the peak inverse voltage is exceeded, the p-n junction breaks down and thereafter is no longer active as a barrier layer.

It has now been found that the breakdown of the p-n junction always occurs at only a few singular points. Consequently, for increasing the inverse voltage limit it would be sufficient if these few "inferior" spots could be eliminated.

To achieve such an improvement is the object of our invention.

Accordingly, our invention concerns itself specifically with a p-n junction device in which a dopant-containing member of metal is alloy-bonded to a monocrystalline semiconductor body in which a region adjacent to the metal member is reversely doped by dopant from the metal member, the latter forming a contact electrode of the device. According to our invention, the semiconductor body in such a device is stepped or offset at, and along, the edge of the electrode so that the slope or front of the resulting shoulder extends perpendicularly or approximately perpendicularly to the area of the contact electrode. According to another feature of our invention, the depth of the offset is equal at least to the thickness of the reversely doped recrystallization region so that the area of the p-n junction is substantially identical in size with the alloy-bonded area of the contact electrode.

The invention will be further explained with reference to the accompanying drawing in which different embodiments of semiconductor devices according to the invention are illustrated by way of example, the illustrations being on enlarged scale, particularly with respect to thickness dimensions, for the purpose of a more lucid representation.

Semiconductor devices of the type illustrated are provided with a semiconductor body which, as a rule, is cut from a monocrystal. The diameter of the slice is 12 to 25 mm., the thickness 200 to 300 microns, for example. The metal members employed for doping are usually applied as foils of about 40 to 100 microns thickness.

Figure 1:
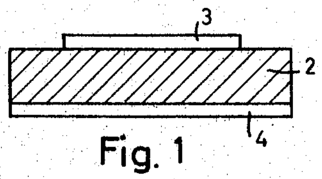
FIGS. 1 and 2 are explanatory and show schematically in cross section a prior-art diode in an initial stage of manufacture and in finished form respectively.
Figure 2:
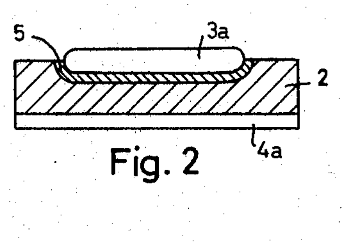

The semiconductor diode according to FIGS. 1 and 2 is made of p-type germanium or silicon. Placed upon the semiconductor body is a piece of metal foil 3 having a somewhat smaller diameter. The foil consists of a gold-antimony alloy containing 1 or 2% antimony as donor dopant, the remainder being gold. The opposite side of the semiconductor 2 is covered with a metal foil 4 which is either neutral or contains a donor dopant. Aluminum or gallium-containing gold may be used for this foil, for example.

The assembled parts according to FIG. 1 are alloyed together. According to a known method, this can be done by embedding the assembled parts in a neutral powder, such as graphite, and heating the whole to a temperature above the eutectic temperatures of the semiconductor and metals employed. When thus proceeding, there first occur melts of super-eutectic composition. When thereafter the assembly is permitted to cool, semiconductor material crystallizes out of the melt and forms a new region 5 which retains some of the dopant and thus reversley dopes the semiconductor material. Hence the region 5 has n-type conductance. At the eutectic temperature, the residual melt solidifies and then forms the contact electrodes 3*a* and 4*a*. The recrystallization region located adjacent to the contact electrode 4*a* is not indicated on the drawing because it possesses the same conductance type as the original material of the semiconductor body 2. Of interest to the present invention is only the opposite side at which the p-n junction between the bulk of body 2 and the newly formed recrystallization layer 5 is located.

Figure 3:
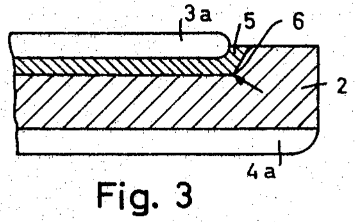
FIG. 3 shows in cross section an enlarged portion of FIG. 2.

We found that each spot at which in the event of electrical overstress, the p-n junction will break down first, exhibits in cross section an appearance different from that of the greatly preponderant portion of the p-n junction. Generally, when cross-sectional cuts are ground, polished and then observed microscopically, the edge zone of a p-n junction in a semiconductor device produced by the alloying method is seen to have a rounded shape. In contrast thereto, the spots at which the breakdown commences exhibits a sharp knee or edge in the marginal portion. In FIG. 3 the sharp point or edge where such a breakdown is apt to occur is identified by an arrow 6. The increased electrical field strength at such singular points thus has been found to be the reason why the breakdown occurs first at these localities.

Further investigation has shown that there is a casual connection between the sharp edge 6 at the p-n junction and the crystalline structure of the semiconductor body. Thus, it was ascertained that in semiconductor bodies having a monocrystalline structure whose (111)-axis extends perpendicularly to the flat side faces of the semiconductor disc, the sharp-edged breakdown location occurs predominantly at three singular points along the margin of the p-n junction area, these points being angularly spaced 120° from each other. It was thus established that these sharp edges stem from the monocrystalline structure and come about in the melting and recrystallizing stages of the alloying process.

According to our invention, these singular, sharp-edge localities are eliminated by the above-mentioned offset in the shape of the semiconductor body. That is, the places or volumetric portions of the semiconductor body where the most endangered points of the p-n junction are situated, are eliminated by the fact that the semiconductor body has a vertical or nearly vertical slope extending at and along the contour of the contact electrode. This will be further apparent from the embodiments of devices according to the invention presently described with reference to FIGS. 4 to 8, it being understood that these devices, in other respects, may be manufactured, for example, in the same manner and with the aid of the same materials described above with reference to FIGS. 1 to 3.

Figure 4:
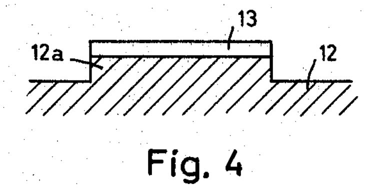
FIG. 4 shows schematically and in section a portion of a semiconductor device in a first stage of manufacture according to the invention.
Figure 5:
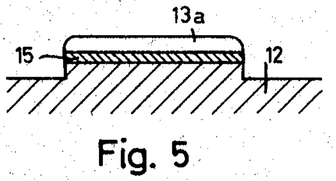
FIG. 5 shows the same device upon completion.

Shown in FIG. 4 is the here essential portion of the semiconductor device, namely the top side, prior to the alloying operation. FIG. 5 shows the same device after the alloying operation. The device is preferably produced by providing the semiconductor body 12 with a mesa-shaped projection 12*a*, for example by mechanical machining such as grinding. Thereafter the dopant-containing metal foil 13 is placed on top of the mesa. Best results are secured if the minimum height of the mesa 12*a* is about equal to the thickness of the metal foil 13. For example, when using a foil of 60 microns thickness, the height of the mesa is preferably 50 to 100 microns.

The alloying operation may be performed in the same or a similar manner as described above. As a result, a reversely doped region 15 is produced adjacent to the bulk of semiconductor material that remained unaffected in body 12, thus forming a p-n junction. This p-n junction is completely planar and does not exhibit the rounded marginal line occurring in the semiconductor device according to FIG. 2. For that reason a sharp edge or point 6 as shown in FIG. 3 can likewise not occur. In this manner the peak inverse voltage of the p-n junction is increased because singular peaks of the electric field strength are avoided.

Figure 6:
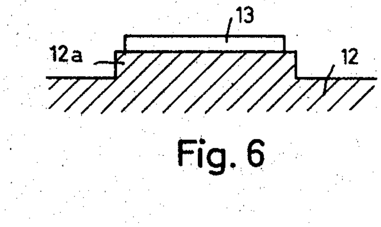
FIGS. 6, 7 and 8 show schematically three further embodiments of semiconductor devices according to the invention during manufacture.

In the embodiment shown in FIG. 6, the metal-foil disc 13 is slightly smaller than the top-face area of the mesa 12*a*. This requires that the marginal contour of the metal disc 13 must not protrude at any place beyond the edge contour of the mesa and, on the other hand, must not be spaced from that contour a distance more than about the thickness of the metal foil. If these precautions are not observed, a non-planar p-n junction may come about with resulting impairment of the electrical properties.

Figure 7:
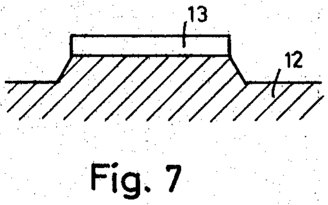
Figure 8:
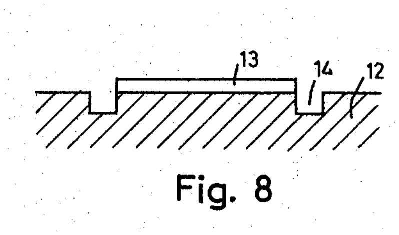

The mesa need not have a strictly vertical slope line. Slight departures are permissible. Thus, FIG. 7 shows an embodiment with a modified slope at which the p-n junction beneath the metal plate 13 is still planar and not substantially larger than the alloyed bonding area between metal plate and semiconductor body.

When machining the mesa projection, the surrounding marginal portion of the semiconductor body may be completely removed as exemplified by the embodiments shown in FIGS. 4 to 7. However, it is also sufficient to cut a groove 14 into the semiconductor body as exemplified in FIG. 8 at 14. When the semiconductor device has circular shape, such a groove can readily be produced by mechanical milling operation. It is preferably given a depth approximately equal to the thickness of the metal disc 13, and a width corresponding approximately to twice the thickness of the metal disc 13. The mesa projection 12*a* or the groove 14 can be produced mechanically such as by grinding, lapping or sand-blasting, or also chemically such as by etching.

After alloying, the semiconductor device can be subjected in the conventional manner to surface etching prior to inserting it into a housing or capsule. However, etching down to the depth of the p-n junction can be omitted. For this reason, the conventional etching step can be omitted if the desired surface cleaning or other surface condition is secured in some other manner.

The invention is not limited to the blocking p-n junction in a rectifying device. It is analogously applicable to transistors other semiconductor devices, for example four-layer (silicon controlled rectifiers and the like) devices having thyratron or switching operation. For example in semiconductor devices with concentric ring electrodes, grooves according to the one denoted by 14 can be machined between the ring electrodes. The mesa-type projection, in the case of ring-shaped electrodes, assumes the appearance of an annular ridge or wall having a planar top surface.

We claim:

1. A semiconductor p-n junction device, comprising a monocrystalline semiconductor body having a substantially planar surface area, a substantially planar dopant-containing electrode member of metal positioned on the surface area of said semiconductor body in face-to-face relation and alloy-bonded to said body, said body having one conductance type and having adjacent to said member a substantially planar region of the other conductance type doped by dopant from said member, said semiconductor member having, at and about, the edge of said metal member an offset having a slope which is substantially perpendicular to the surface area of said semiconductor body and having a minimal depth which is substantially equal to the thickness of said planar electrode member.

2. The method of producing a semiconductor p-n junction device, which comprises machining a monocrystalline semiconductor body of a given conductance type to provide the body with a mesa portion extending substantially perpendicular to said semiconductor body and having a planar top area, alloying into the top area a dopant-containing metal foil whose edge is within the contour of the mesa top area and maximally spaced from the contour a distance about equal to the thickness of the metal plate.

3. A semiconductor p-n junction device comprising a monocrystalilne semiconductor body having a substantially planar surface area, a substantially planar dopant-containing electrode member of metal positioned on the surface area of said semiconductor body in face-to-face relation and alloy-bonded to said body, said electrode member having boundary edges, said body having one conductance type and having adjacent to said member a substantially planar region of the other conductance type doped by dopant from said member, said semiconductor member having, at and about, the edge of said metal member an offset having a slope which is substantially perpendicular to the surface area of said semiconductor body, the boundary edges of said electrode member being spaced from the edges of said offset a distance substantially equal to the thickness of said electrode member.

4. A semiconductor p-n junction device comprising a monocrystalline semiconductor body having a substantially planar surface area, a substantially planar dopant-containing electrode member of metal positioned on the surface area of said semiconductor body in face-to-face relation and alloy-bonded to said body, said electrode member having boundary edges, said body having one conductance type and having adjacent to said member a substantially planar region of the other conductance type doped by dopant from said member, said semiconductor member having, at and about, the edge of said metal member an offset having a slope which is substantially perpendicular to the surface area of said semiconductor body and having a minimal depth which is substantially equal to the thickness of said planar electrode member, the boundary edges of said electrode member being spaced from the edges of said offset a distance substantially equal to the thickness of said electrode member.

5. The method of producing a semiconductor p-n junction device, which comprises machining a monocrystalline semiconductor body of a given conductance type to provide the body with a mesa portion extending substantially perpendicular to said semiconductor body and having a planar top area, alloying into the top area a dopant-containing metal foil having a thickness which is substantially equal to height of said mesa portion above said semiconductor body and whose edge is within the contour of the mesa top area and maximally spaced from the contour a distance about equal to the thickness of the metal plate.

References Cited by the Examiner

UNITED STATES PATENTS

| | | | |
|---|---|---|---|
| 2,964,689 | 12/1960 | Buschert et al. | 148—177 |
| 3,025,439 | 3/1962 | Anderson | 148—177 |
| 3,042,565 | 7/1962 | Lehover | 148—177 |
| 3,087,100 | 4/1963 | Savadelis | 148—178 |

DAVID L. RECK, *Primary Examiner.*

HYLAND BIZOT, R. O. DEAN, *Examiners.*